(12) United States Patent
Haffner

(10) Patent No.: US 8,092,958 B2
(45) Date of Patent: Jan. 10, 2012

(54) MASK AND METHOD FOR PATTERNING A SEMICONDUCTOR WAFER

(75) Inventor: Henning Haffner, Pawling, NY (US)

(73) Assignee: Infineon Technologies AG, Munich (DE)

( * ) Notice: Subject to any disclaimer, the term of this patent is extended or adjusted under 35 U.S.C. 154(b) by 1092 days.

(21) Appl. No.: 11/527,075

(22) Filed: Sep. 26, 2006

(65) Prior Publication Data

US 2008/0076036 A1   Mar. 27, 2008

(51) Int. Cl.
*G03F 7/20* (2006.01)
*G03F 1/00* (2006.01)

(52) U.S. Cl. .............................. 430/5; 430/311

(58) Field of Classification Search ............... 430/5, 311
See application file for complete search history.

(56) References Cited

U.S. PATENT DOCUMENTS

| | | | |
|---|---|---|---|
| 2005/0008942 A1* | 1/2005 | Cheng et al. | 430/5 |
| 2005/0042527 A1* | 2/2005 | Pierrat | 430/5 |
| 2007/0231711 A1* | 10/2007 | Aton et al. | 430/5 |

* cited by examiner

*Primary Examiner* — Kathleen Duda
*Assistant Examiner* — Brittany Raymond
(74) *Attorney, Agent, or Firm* — Slater & Matsil, L.L.P.

(57) ABSTRACT

A mask and method for patterning a semiconductor wafer is disclosed. A mask set is fabricated on a transparent substrate. A mask layer comprising mask region elements that transmit light is disposed on the substrate, wherein each mask element is segmented into a plurality of segments.

31 Claims, 10 Drawing Sheets

MASK AND METHOD FOR PATTERNING A SEMICONDUCTOR WAFER

TECHNICAL FIELD

This invention relates generally to the fabrication of semiconductor devices and particularly to a patterning mask and method.

BACKGROUND

The accurate reproduction of patterns on the surface of a semiconductor substrate is critical to the proper fabrication of semiconductor devices. The semiconductor substrate may have undergone previous fabrication processes and may already feature layers and structures created by those fabrication processes. Improperly reproduced patterns can result in semiconductor devices that do not operate to design specifications or do not operate at all. For example, transistors can be created with improperly sized gates, conductors can be created that are short circuited or open circuited with other conductors or devices, structures can be created with wrong geometries, and so forth. Improperly reproduced patterns can reduce the yield of the fabrication process, thereby increasing the overall cost of the product. The reproduction process typically involves the use of optical lithography to reproduce the patterns onto the surface of the semiconductor substrate that is subsequently followed with a variety of processes to either subtract (for example, etch) and add (for example, deposit) materials from and to the semiconductor substrate.

However, as the dimensions of the structures making up the patterns continue to become smaller, their sizes approach (in some cases, the dimensions of the structures are smaller than) wavelength of the light used in optical lithography, the interference and processing effects can cause distortions and deviations in the patterns as they are reproduced onto the semiconductor substrate. In addition to the relationship between structures of the patterns and the wavelengths of the light, other factors that can cause distortion include the numerical aperture of the imaging system and the minimum pitch between structures in the pattern. The result being a reproduced pattern having a dramatically different appearance from the pattern being reproduced, also known as the intended pattern. The distortions and deviations in the reproduced pattern are dependent upon the characteristics of the pattern, such as the shape and size of the structures in the pattern, the presence of neighboring patterns and structures around the pattern, as well as the process conditions. For example, the interactions of the light with the structures making up a pattern can result in the reproduced pattern having rounded corners, bulges towards another elements, and so forth.

With reference now to FIGS. 1a and 1b, there are shown diagrams illustrating an exemplary pattern used in semiconductor device fabrication and a simulated reproduced pattern on a semiconductor substrate. The diagram shown in FIG. 1a illustrates a pattern 100 that is to be reproduced on a semiconductor wafer. The pattern 100 includes a plurality of structures, such as structure 105, structure 106, structure 107, structure 108, and structure 109. Ideally, there will be a one-to-one correspondence between the pattern 100 and the reproduced pattern on the semiconductor substrate.

The diagram shown in FIG. 1b illustrates a simulation of the pattern 100 as it is reproduced onto the semiconductor substrate. For example, if a threshold photoresist model is used and the dose is set to a value of 3.3 times the dose-to-clear (i.e., the dose required to develop the resist in a large clear area), then intensities of greater than or equal 0.3 will print in the photoresist. These thresholds are shown in FIG. 1b. The diagram illustrates that the more isolated regions of the pattern 100 reproduce smaller, for example, pattern 130 and pattern 132, than the more nested regions, for example, pattern 134 and pattern 136.

Optical proximity correction (OPC) is a known technique wherein fragments of the structures making up the pattern can be modified (moved) so that associated mask patterns no longer look like the intended pattern, but through the previously discussed interactions between the light and the structures, the reproduced pattern on the semiconductor substrate made using the modified mask patterns will have an appearance that is closer to the intended pattern in appearance than the reproduced pattern made using the unmodified patterns. OPC is normally performed using computer-aided design (CAD) tools and involves the partitioning of edges of structures of a pattern into multiple fragments, which can be moved around to yield the desired reproduced pattern.

In some cases, however, conventional OPC techniques fail to adequately correct for pattern deviations because the required pattern modifications on the mask would violate mask design rules that define minimum line width and line spacing. This is particularly an issue with some resolution enhancement techniques using alternate phase shift masks (AltPSM) or attenuated phase shift masks where large deviations in the mask geometry could be required to affect small changes in the image geometry on the target wafer. What is needed are improvements to resolution enhancement techniques for reproducing patterns with a uniform width in cases where the use of conventional OPC techniques are impractical.

SUMMARY OF THE INVENTION

In one embodiment, a mask set is fabricated on a transparent substrate. A mask layer including mask region elements that transmit light is disposed on the substrate. Each mask element is segmented into a plurality of segments.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to preferred embodiments in a specific context, namely an optical lithography system for the reproduction of patterns of very small dimensions. The invention may also be applied, however, to semiconductor fabricating processes with other forms of lithography wherein the wavelength of the electromagnetic waves used to transfer the patterns approaches the dimensions of the patterns. The invention can also be used in lithography processes outside the semiconductor field. For example, the invention can be applied to lithography processes where an interaction between the wavelength, the numerical aperture of the imaging system and a minimum pitch between structures can cause distortions in the reproduction of mask patterns.

Figure 1A:
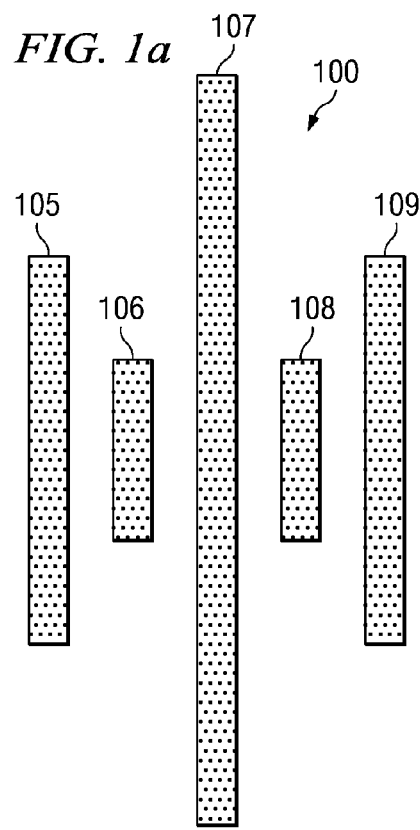
FIGS. 1a-1b are exemplary figures describing photolithography process and its difficulties.
Figure 1B:
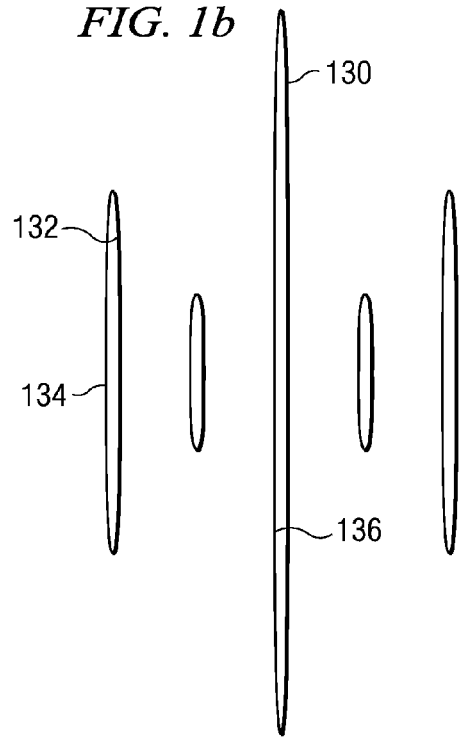
Figure 2:
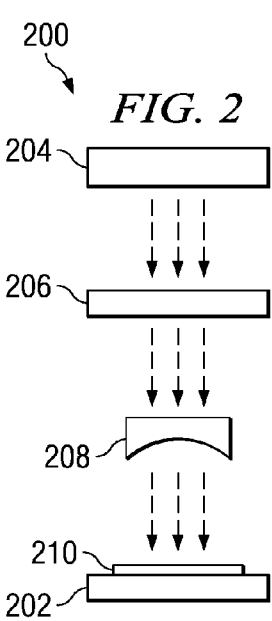
FIG. 2 is a diagram of the photolithography system.

In various embodiments of the invention, the mask can be designed to improve the pattern and structures created on the surface of the silicon wafer. An apparatus 200 for patterning the surface of a semiconductor wafer 210 is shown in FIG. 2. A stage 202 is adapted to support a semiconductor wafer 210. The stage 202 may be adapted to move the entire wafer 210 from position to position in order to expose portions of a resist over the wafer 210 surface during the patterning process. The stage 202 may be mounted on a base, not shown. The stage 202 is adapted to securely hold the wafer 210 in place. A lens 208 is disposed above the wafer 210. Lens 208 typically comprises a demagnification lens that reduces the image transferred to the wafer 30 by 4-5×, for example. While lens 208 is depicted in the figure as a single lens, lens 208 will in most cases include a system of lenses. Alternatively, no lens 208 may be required if a 1:1 ratio magnification scheme is used for transferring the pattern from the mask 206 to the wafer 210. A mask 206 having the desired pattern to be transferred to the wafer 210 is disposed above lens 208. A light or energy source 204 is disposed above mask 206, as shown.

To pattern the wafer 210, the light source 204 which may comprise a laser or ultraviolet light, for example, is illuminated. The light passes through the mask 206, through demagnification lens 208, and exposes portions of photoresist on the top surface of the semiconductor wafer 210.

There are various types of exposure tools that function similarly to the apparatus 200 described and illustrated in FIG. 2. In a step and repeat apparatus, the mask 206 pattern is transferred onto a section of the wafer 210 at a time, and a stage 202 moves the wafer 210 from point to point, exposing the wafer 210 surface in a plurality of steps. An alternative apparatus used to pattern and expose a wafer 210 surface is known as a step and scan apparatus, for example.

In the preferred embodiment of the present invention, enhancement techniques are used to modify the patterns on mask 206 and thereby improve the integrity of the exposed images on the wafer 210. In a conventional integrated circuit lithography system, an ideal mask pattern using a given mask technique is designed for a given integrated circuit layout without small geometry imaging distortions being taken into account. The ideal mask geometry is then processed using OPC techniques wherein the mask pattern geometry is adjusted to compensate for imaging distortions. Some mask techniques, however, create geometries that are not completely correctable using conventional OPC techniques.

Figure 3A:
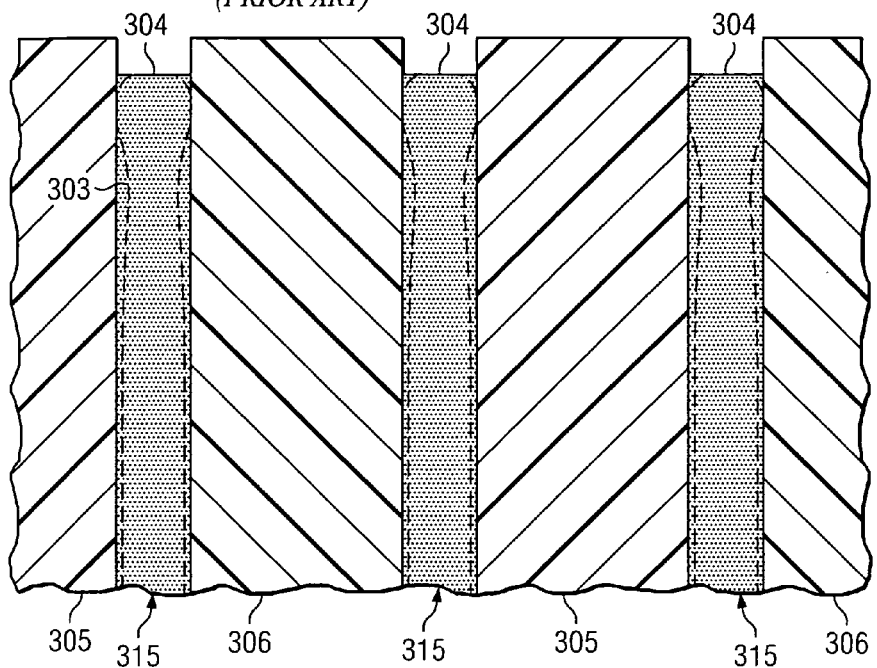
FIGS. 3a-3c are diagrams of a composite pattern and various mask layers decomposed from the composite pattern.

One commonly used mask technique uses an alternating phase shift mask (altPSM). AltPSM is a resolution enhancement method which uses specific types of masks. As shown in FIG. 3a, a known alternating phase shift mask includes two alternating phase mask structures, 305 and 306 which pass light, with the remaining part of the mask being opaque. The first structure 305 may pass light with a phase shift of 0°, while the second structure 306 may pass light at 180°. When the mask 206 is exposed to a light source, the phase shifted light passing through mask elements 305 and 306 to expose the regions surrounded by target elements 315. Typically a trim mask (not shown) is used to expose the regions at the end of the structure to ensure that the originally non-exposed area stays within the bounds defined by the target elements 315. While a trim mask is typically used in the altPSM technique, it is not typically used in other mask techniques such as attenuated PSM and binary masks.

While the altPSM technique combined with some known OPC technique is effective at exposing the photoresist to patterns that are close to the desired target, there are still some major deviations from the target 315 caused by mask corner proximity effects caused by the typically highly coherent light sources used in the exposure process. FIG. 3a illustrates the problem of necking. Structures 305 and 306 represent the phase masks, structure 315 represents the target structures, and structure 302 represents the actual exposed pattern. The trim mask structure is not shown on the diagram for simplicity. When the mask structures are used as shown, a narrow area 303 or "neck" will result. Such necking and across device line-width variations (ADLV), in general, can result in shorts, opens, and other device failures in the resulting semiconductor circuit. Such necking also worsens through focus, raising the risk of catastrophic openings in the resist. While this example shows the necking phenomenon in the context of altPSM, necking can also occur in other forms of exposure such as attenuated PSM, binary masks, and other mask techniques.

Figure 3B:
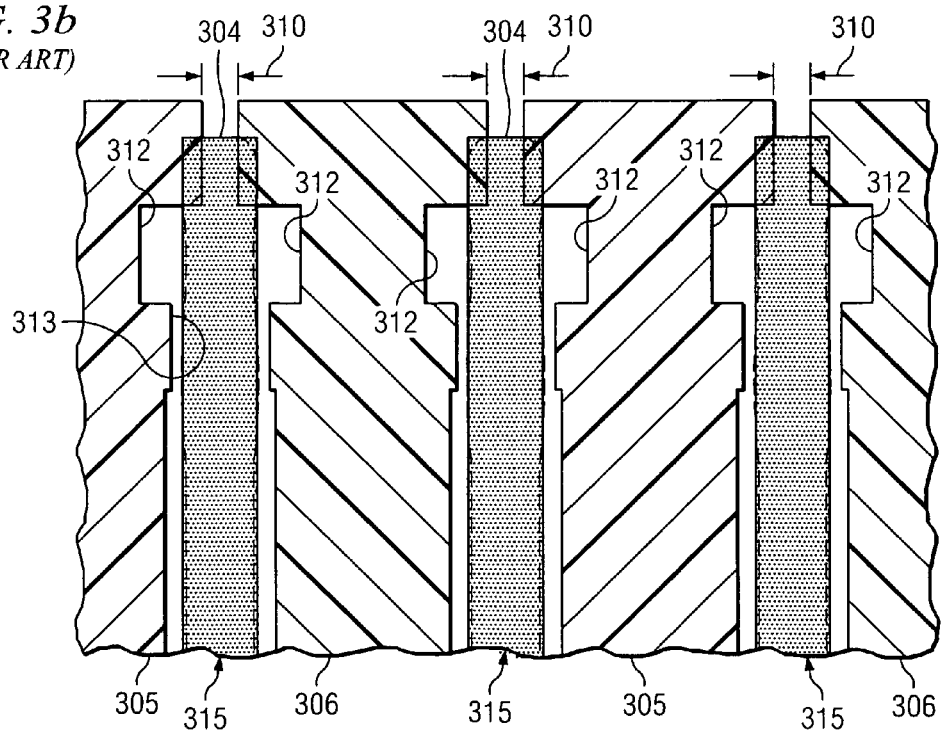

One possible and known technique that could be used to correct the problem of necking is to use OPC to adjust the mask to compensate for the necking, as shown in FIG. 3b. In order to compensate for the necking, gap 312 and projection 313 are created in the phase mask layers. Additionally, the gap 310 at the end of the pattern is narrowed, thus reducing magnitude of the necking in resultant pattern 304. OPC is also applied to the trim mask (not shown), but its effect is also reflected in the imaged pattern 304. A disadvantage with this solution, however, lies in the fact that some resolution enhancement techniques, such as altPSM have a low mask error enhancement factor (MEEF). MEEF is defined as the ratio of the amount of dimensional change in a mask feature normalized to wafer dimensions, to the change in dimension of the resultant resist feature. In the present embodiment process, MEEF values of 0.5 are typical, meaning that if the resultant image needs to be adjusted by 10 nm, the mask would need to be adjusted by 20 nm multiplied by the mask magnification factor, typically 4×. In very fine geometry processes, such as the one used by the present embodiment of the present invention, such large mask adjustments can potentially violate the so called mask manufacturing rules. For example, gap 310 in FIG. 3b may be too narrow for the mask to be reliably manufactured. Additionally, even when ignoring those manufacturing concerns, known OPC techniques typically still are not able to correct the mask pattern adequately. Some necking typically remains due to limitations of the known OPC techniques such as the fragmentation granularity or inappropriate set evaluation points.

Figure 3C:
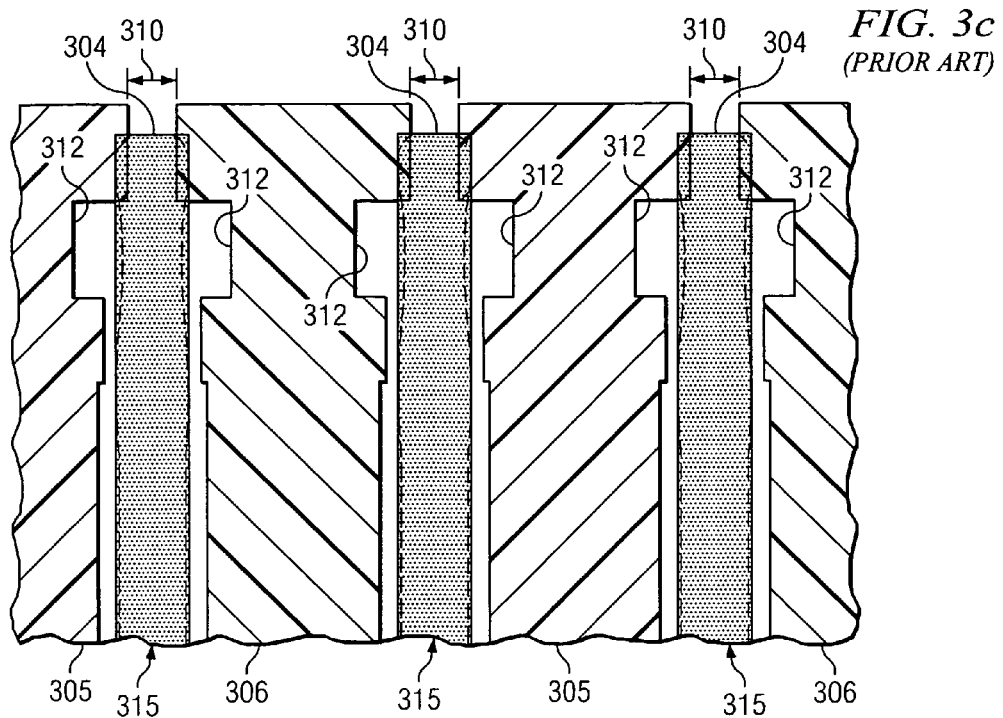

FIG. 3c shows an example of what would happen if gap 310 were widened to conform to the mask design rules. When gap 310 is widened, necking is even less adequately compensated and the resultant pattern 304 does not sufficiently conform to the target structure 315.

Another solution to the necking problem is to extend line-ends even further "outside" the active gate area. A major disadvantage to this solution, however, is that chip area must be sacrificed to accommodate the increased line ends. Such an increase in chip area will increase the cost of the resulting integrated circuit.

Figure 4A:
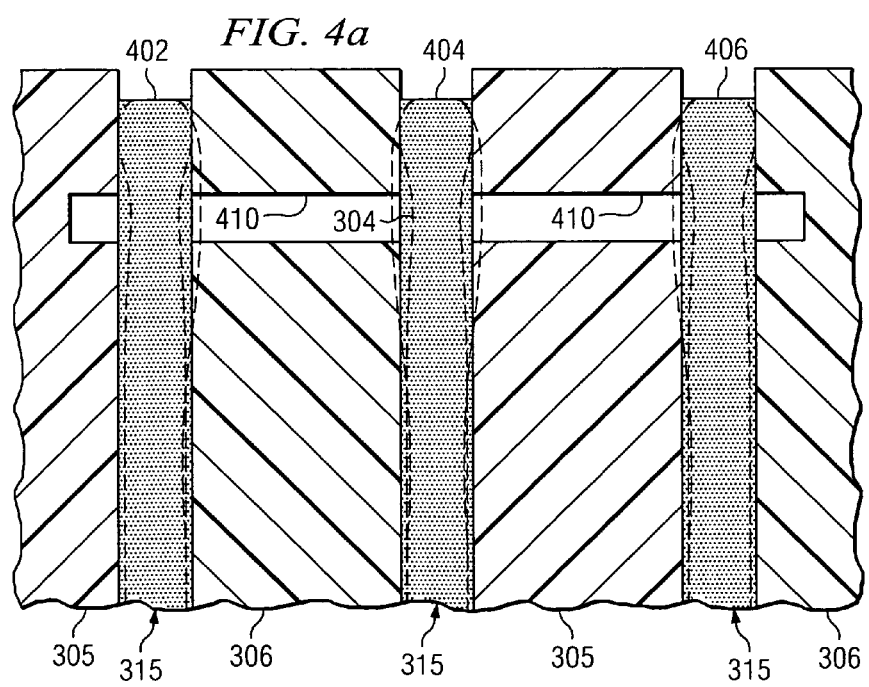
FIGS. 4a-4c are composite patterns describing a derivation of the preferred embodiment of the present invention.
Figure 4B:
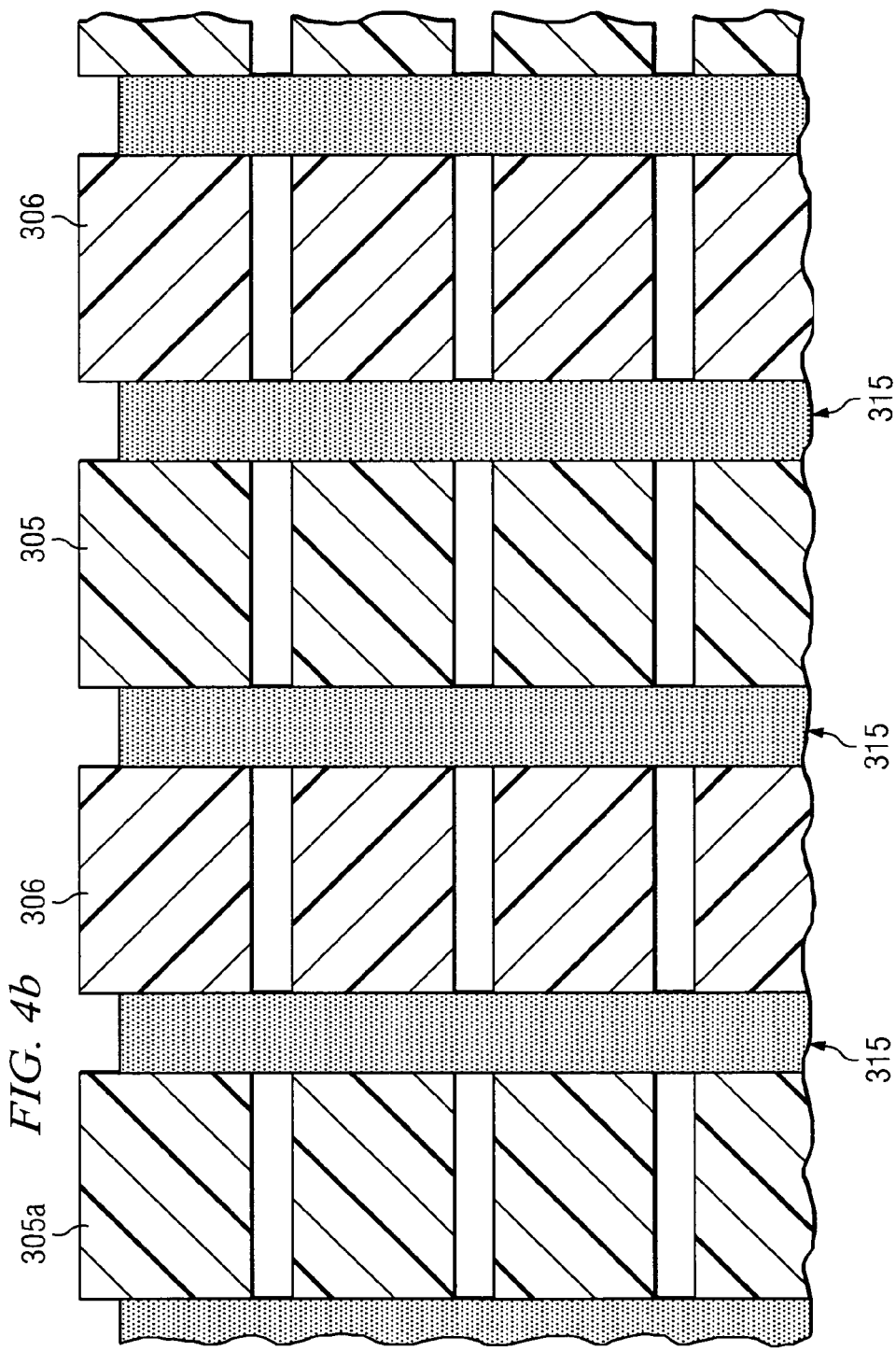
Figure 4C:
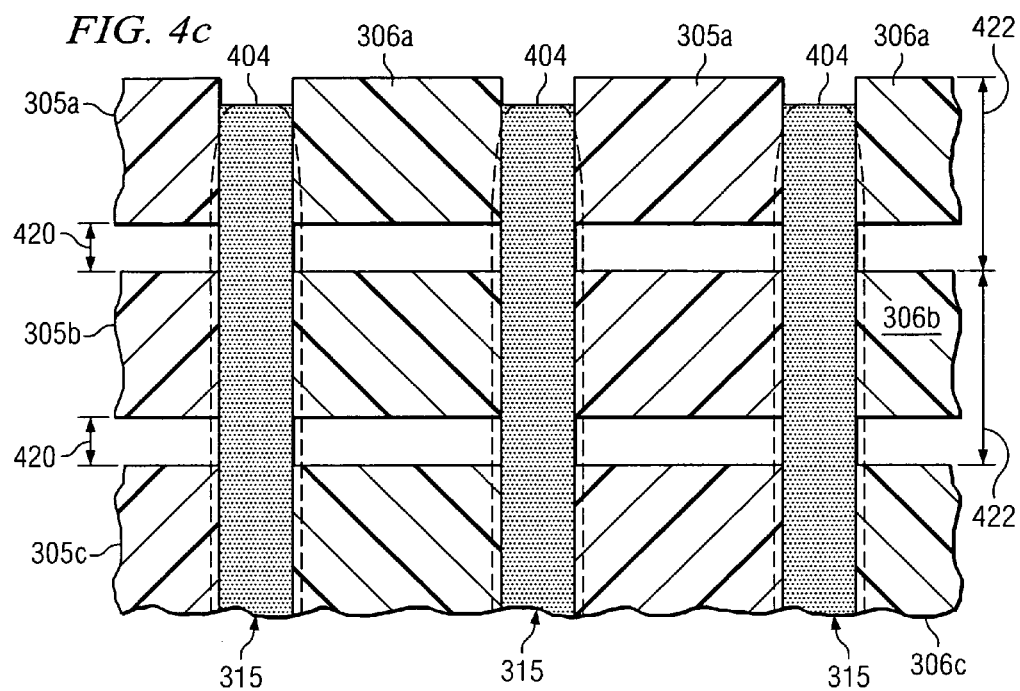

FIGS. 4a-4c illustrate another solution to the necking problem that forms the basis of a preferred embodiment of the present invention.

In one solution shown in FIG. 4a, it is shown that if a slot 410 is cut through the phase masks 305 and 306 approximately at the point where the necking in the prior resultant etch pattern 304 is most prominent, resultant pattern 404 is straightened out, but the necking is pushed further down the length of the pattern 404, especially when compensating for the resulting line width deviations with OPC (not shown). This is because the newly generated corners resulting from slot 410 of the phase mask cause necking further down at about the same distance as the original neck from the original corners of the line-end. These slots can be replicated so that phase mask sections 305 and 306 are divided into segments as shown in FIG. 4b.

Turning to FIG. 4c, showing a preferred embodiment of the present invention after OPC has been applied to both the phase mask as well as the trim mask (not shown), it can be seen that the creation of additional slots or segments in phase mask sections 305 and 306, has the effect of reducing the effect of necking in the resultant pattern 404. In conditions were the light source is very coherent with strong proximity effects, the necking itself and its reduction is predictable and repeatable. For altPSM, a very coherent light source is typically used.

The most significant variables that effect necking are segment gap width 420, segment pitch 422, exposure wavelength, numerical aperture, and the partial coherence factor, sigma. Other process variables can also affect necking, but they typically exert a second order effect. The most significant of these variables on the effect of necking is the segment pitch 422. The segment gap width 420 contributes primarily to the width of the resultant image 404, while the segment pitch 420 determines the amount of "waviness" of the resultant image 404.

Figure 5:
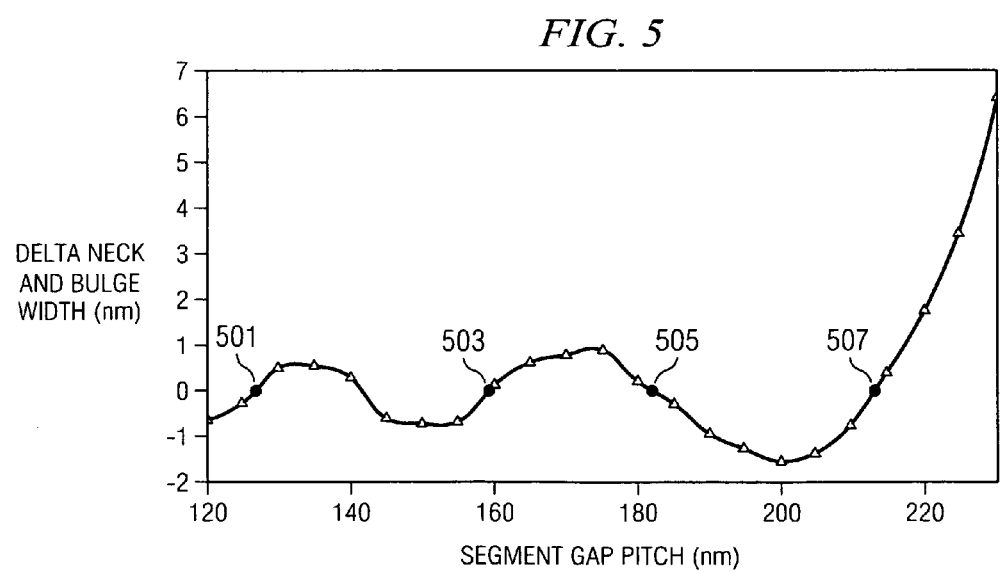
FIG. 5 is a graph of parameters pertaining to the preferred embodiment of the present invention.

FIG. 5 shows a graph of the difference between the widest and most narrow portion (waviness) of the resultant image 404 versus segment gap pitch for possible embodiments of the present invention. As shown by the graph, there are multiple gap pitches (labeled 501, 503, 505, & 507) that yield zero-waviness. The selection of these pitches is determined by such factors as the amount of OPC needed, mask manufacturability, and their stability versus tolerances of influencing parameters. Pitch 505 at about 180nm is an example of a suitable pitch because the segment pitch of 180 nm is easily manufacturable in the present embodiment process, and because the slope about pitch 505 is minimal. Pitch 507 at about 215 nm is even more preferred in terms of mask manufacturing, but the higher slope at pitch 507 has the major disadvantage that for real designs the actually applied pitch may need to differ slightly to successfully segment a given mask feature 305/306. Points 501 and 503 are less desirable because the smaller pitch prevents more light from reaching the resist, so the actually applied dose would have to be much higher, or the gap dimensions would drop below the mask manufacturing limit.

Figure 6:
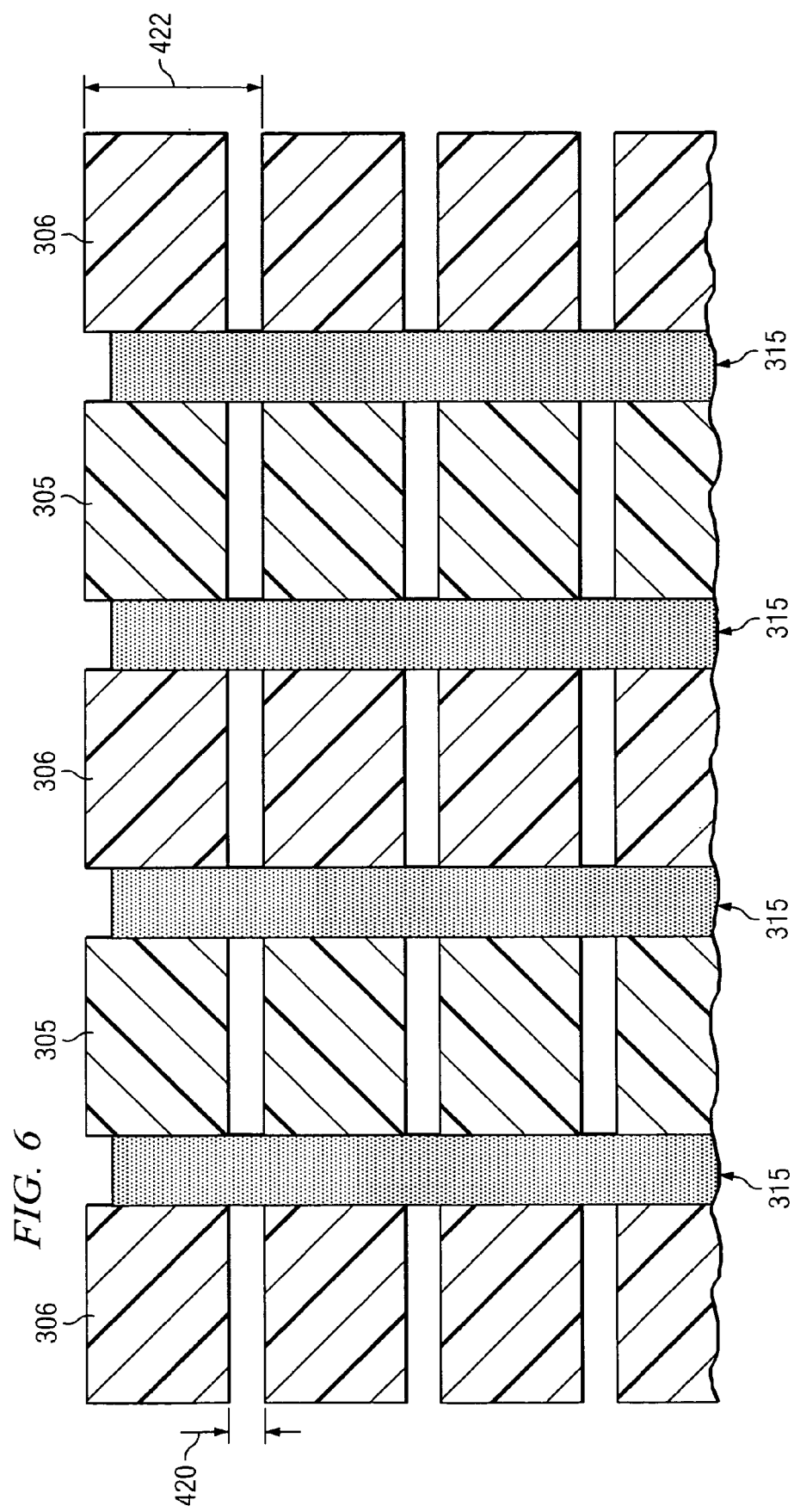
FIG. 6 is a composite pattern, according to the preferred embodiment of the present invention.

A preferred embodiment of the present invention is shown in FIG. 6. Alternating phase mask features 305/306 are shown along with target structures 315. The trim mask is not shown for clarity. Each alternating phase mask element 305/306 is segmented at a predefined pitch 422 and with a predefined gap width.

Figure 7:
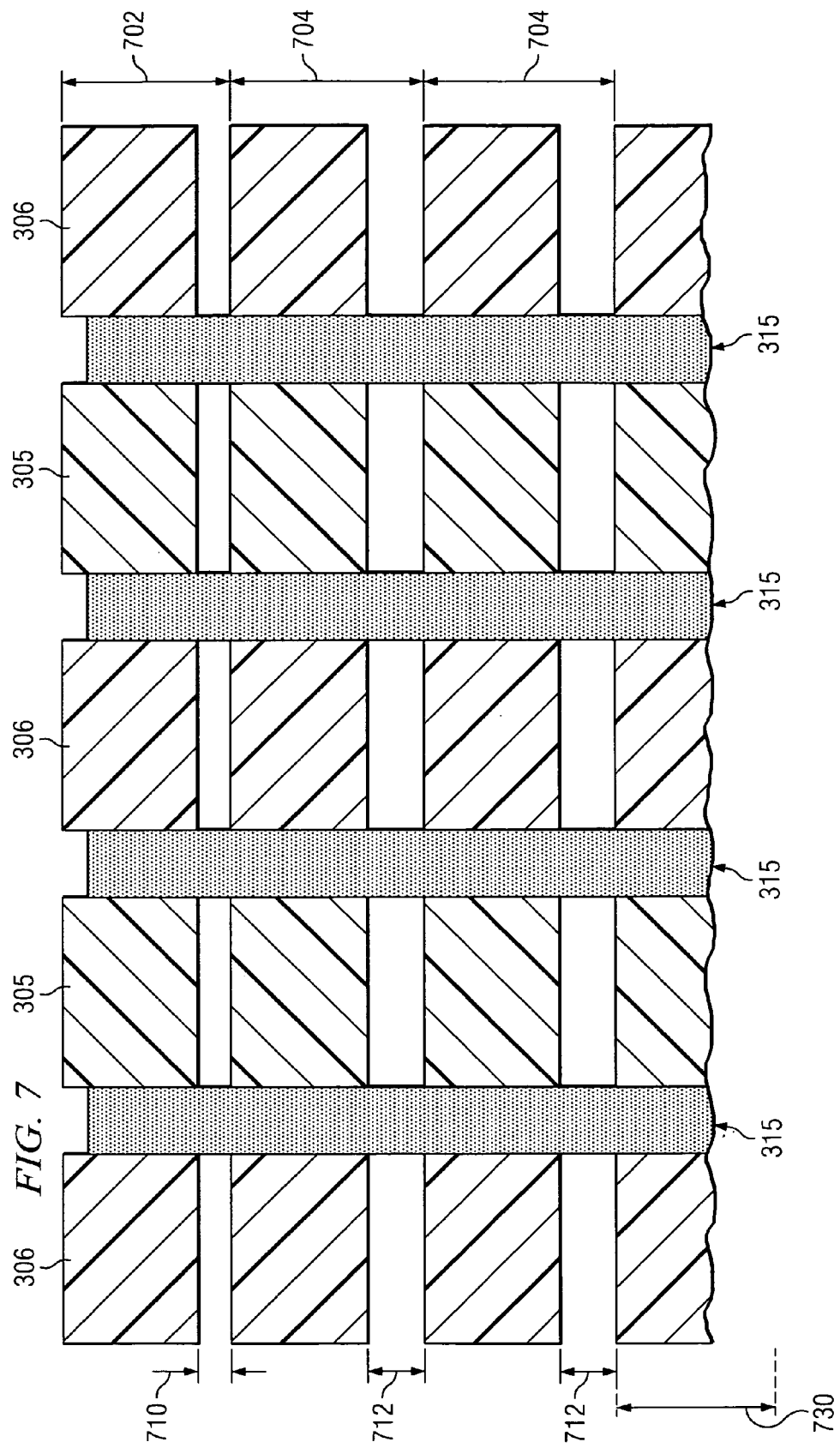
FIG. 7 is a composite pattern, according to an alternate embodiment of the present invention.

An alternate embodiment of the present invention is shown in FIG. 7. Alternating phase mask features 305/306 are shown along with target structures 315. The trim mask is not shown for clarity. Each alternating phase mask element 305/306, however, is segmented at multiple pitches 702/704 and at multiple gap widths 710/712. If each of these pitches corresponds to "zero-waviness" pitches in the graph in FIG. 5, then the resulting etched pattern may have a substantially minimal difference between neck width and bulge width. Following the "zero-waviness" pitches only, however, may not lead to the desired dimension because of the impact from the trim mask reaching down from the end. The last segment on the end may have a different pitch, combined with a different gap width, to compensate for the effect of the trim mask.

This embodiment of the present invention shown in FIG. 7 can also be used if the desired phase mask elements' lengths are not a multiples of a single preferred gap pitch 702. In other embodiments of the present invention, the segment pitch may be varied by altering the segment length and keeping a constant gap width 710, rather than keeping a constant segment length 730 and altering the gap width 710/712 as shown. In yet other embodiments, both the segment length 730 and the gap width 710/712 may be varied.

In other embodiments of the present invention where the desired line length is not a multiple of the preferred segment pitch, adjustments to the line length may be made by starting all line ends at the preferred segment pitch and solving pitch conflicts in the middle of the line by making gradual pitch transitions. In another, but similar embodiment, segments could start in the middle with the preferred line pitch and gradual pitch adjustments be made toward near the line-ends. In yet another embodiment, adjustments could be made by making slight deviations in the segment pitch of one particular phase shape.

Figure 8:
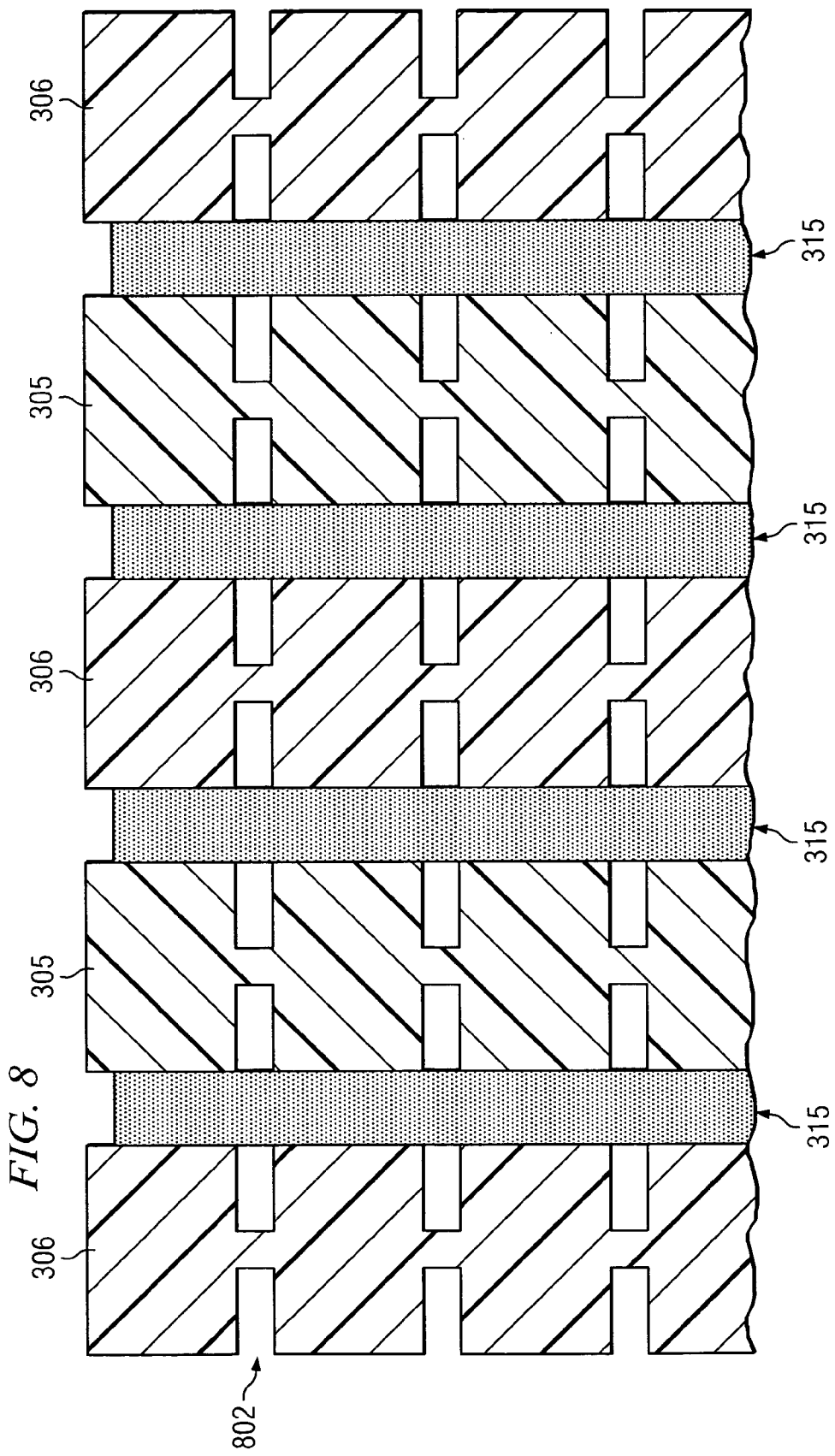
FIG. 8 is a composite pattern, according to an alternate embodiment of the present invention.

FIG. 8 shows an alternate embodiment of the present invention were the phase mask elements 305/306 are partially segmented rather than completely segmented. This embodiment can be implemented with the embodiment of either FIG. 6 or FIG. 7. The length of each partial segment can be determined empirically or mathematically.

Figure 9:
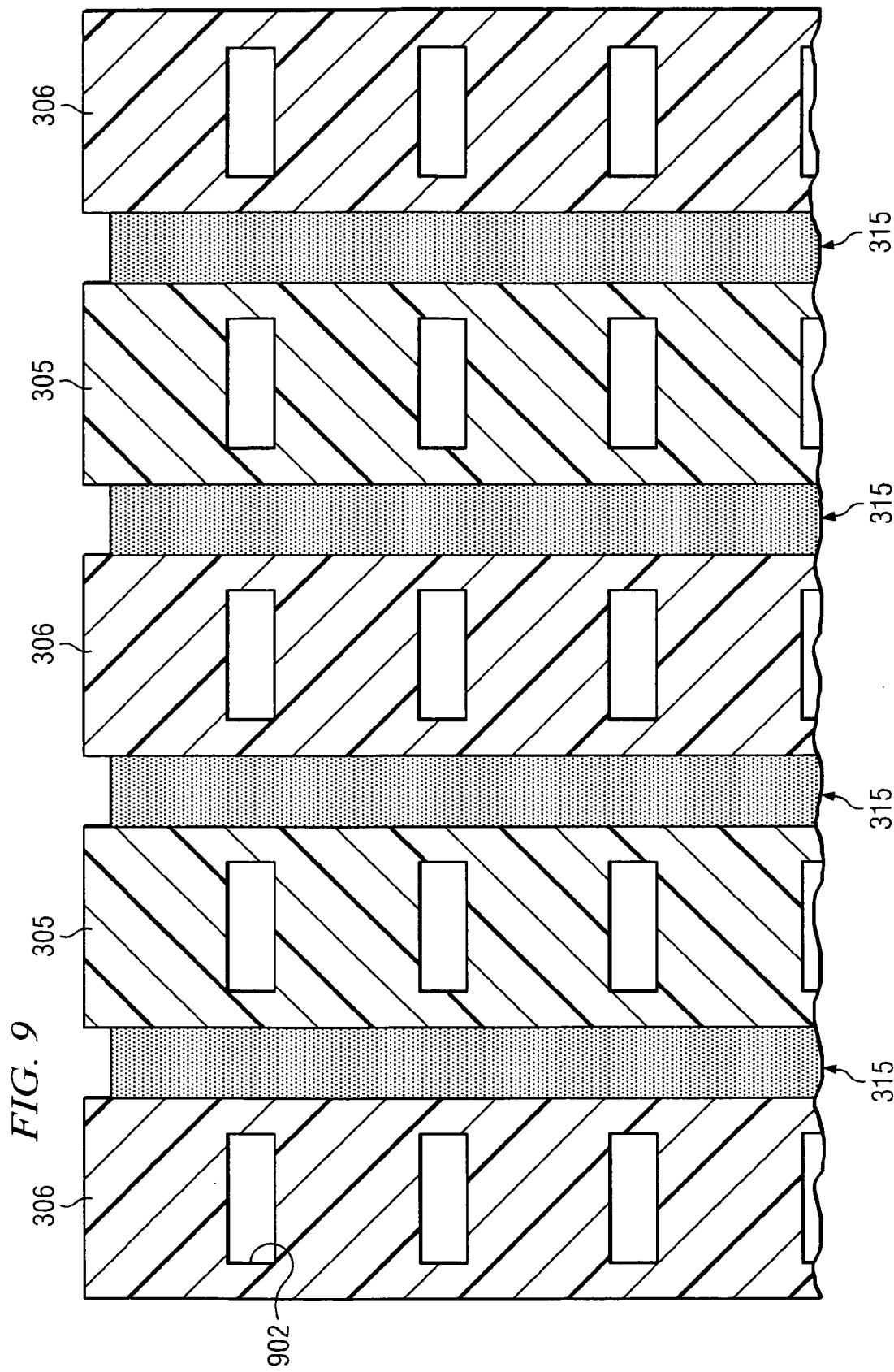
FIG. 9 is a composite pattern, according to an alternate embodiment of the present invention.

FIG. 9 shows an alternate embodiment of the present invention were opaque sections 902 are made in the phase mask elements 305/306 at a similar periodicity as the segments in the other embodiments described herein above. The size of the opaque sections 902 can be determined empirically or mathematically.

Each of these masks can be used to fabricate a semiconductor device using a system as shown in FIG. 2. In a preferred embodiment of the present invention, a mask 206 is provided with light transmissive sections broken up into elements as described above herein, and a semiconductor wafer 210 is provided on which a layer of resist is deposited. The resist layer is irradiated by a light source 204 shining through the mask 206 and preferably through a lens 208. Once the resist layer is exposed to the light source 204, further processing is performed to develop the resist and processing is continued.

The description of the embodiments of the present invention described herein assume the use of a positive resist, where exposed portions of resist are cleared from the wafer prior to processing. Other embodiments of the present invention could use negative resist, where unexposed portions of resist are cleared from the wafer prior to processing. Using negative resist for embodiments of this invention where alternating PSM, attenuated PSM, or binary masks are used could be advantageous in the creation of trenches. In other embodiments of the present invention, the tone of the feature could be inverted on the mask for both types of resist types: negative tone and positive tone. In these cases, the blocking regions that comprise opaque or semi-transparent sections of the mask would be segmented rather than the light transparent segments. AltPSM, however, requires that the light transmissive sections be broken up into elements.

Figure 10A:
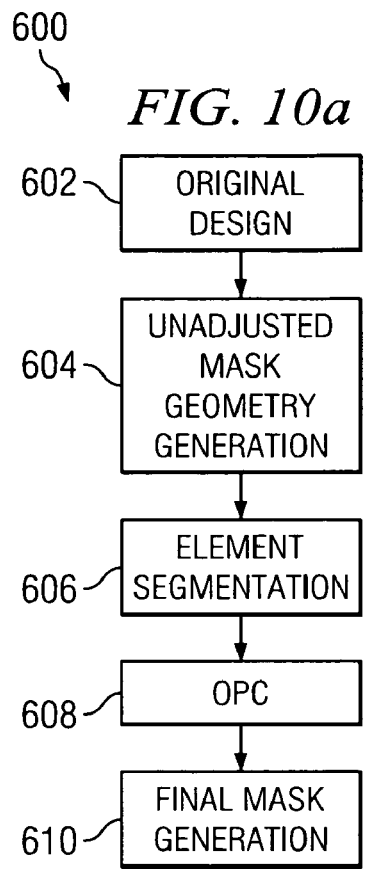
FIGS. 10a-10b are flowcharts describing an implementation of some embodiments of the present invention.
Figure 10B:
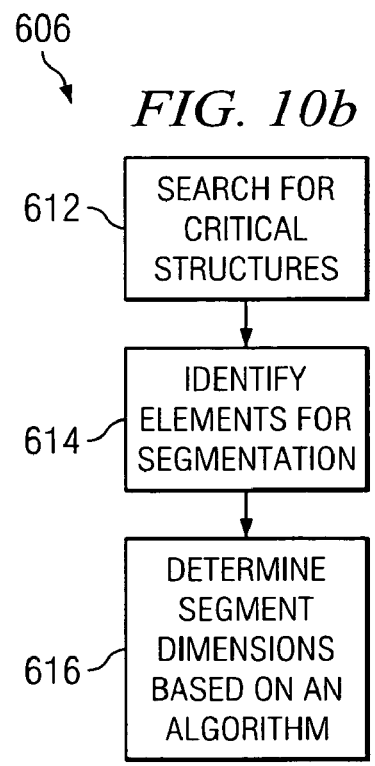

FIGS. 10a-10b are flowcharts describing a typical implementation process of embodiments of the present invention.

Turning to FIG. 10a, the general implementation flow starts with an original geometric design 602. In the field of integrated circuit design, this could be an integrated circuit layout, however, in other embodiments, this could be any other form of small geometry pattern. From the original design, an unadjusted mask geometry is generated in step 604. In some embodiments of the present invention, the unadjusted mask may comprise resolution enhancement techniques such as altPSM or attenuated PSM. In other embodiments of the present invention, this mask may be a binary mask. After the unadjusted mask geometry is generated, the concepts of the present invention are applied and elements on the mask are segmented in step 606 creating a segmented mask geometry. In step 608, OPC techniques are applied to the segmented mask geometry, and a final mask in generated in step 610.

FIG. 10b shows the process of determining mask segment geometries in step 606. To determine which elements are to be segmented, a search for critical structures, which could be lines or spaces, below a certain dimensional limit in the unadjusted mask geometry is performed in step 612. Typically this dimensional limit is on the order of the minimum process geometry. For example, in a 65 nm process, the dimensional limit is on the order of about 65 nm (wafer dimensions). Once the critical structures have been identified, neighboring elements that require segmentation are identified in step 614. In step 616, segment dimensions are determined based on a predetermined algorithm. In some embodiments, this algorithm can be determined empirically and in other embodiments this algorithm can be mathematically based.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of making a semiconductor device, the method comprising:
   providing a mask with a pattern formed thereon, the mask including a first mask layer comprising mask region elements, wherein
      each mask element is segmented into at least three non-contiguous segments, wherein there is a predetermined pitch and a predetermined gap between the at least three non-contiguous segments, the predetermined pitch and gap of the at least three non-contiguous segments selected such that a difference between a maximum width and a minimum width along a length of a resulting pattern is reduced;
   providing a semiconductor wafer having a resist layer formed thereon;
   irradiating the resist layer through the mask to expose an upper surface of the wafer thereby forming the resulting pattern; and
   performing a process to affect the upper surface of the wafer.

2. The method of claim 1, wherein the mask region elements comprise adjacent mask region elements.

3. The method of claim 1, wherein the mask layer comprises an alternating phase shift mask and wherein each mask element transmits light.

4. The method of claim 3, wherein the mask further comprises providing a second mask with trim elements and irradiating the resist layer through the second mask.

5. The method of claim 1, wherein the mask layer comprises an attenuated phase shift mask or a binary mask and wherein each mask element transmits light.

6. The method of claim 1, wherein the mask layer comprises an attenuated phase shift mask or a binary mask and wherein each mask element is semi-transparent or opaque.

7. The method of claim 1, wherein the predetermined pitch and predetermined gap between segments is periodic.

8. The method of claim 1, wherein the predetermined pitches and predetermined gaps between segments of the mask element are asymmetric.

9. The method of claim 1, wherein a least one segment within a mask element further comprises a blocking region, the blocking region comprising an opaque or semi-transparent area.

10. The method of claim 1, wherein the resist layer comprises positive resist.

11. The method of claim 1, wherein the resist layer comprises negative resist.

12. A method of making a semiconductor device, the method comprising:
   providing a mask with a pattern formed thereon, the pattern including at least two substantially parallel edges, the substantially parallel edges being separated by a region of a first tone value, the region of the first tone value being divided into at least three non-contiguous segments, wherein
      each of the at least three non-contiguous segments is separated from a neighboring segment by a blocking region of a predetermined dimension,
      the blocking region comprises a region of a second tone value, and
      the predetermined dimension of the blocking region between each of the at least three non-contiguous segments is selected such that a difference between a maximum width and a minimum width along a length of a resulting pattern is reduced;

providing a semiconductor wafer having a resist layer formed thereon;

irradiating the resist layer through the mask to expose an upper surface of the wafer forming the resulting pattern;

removing a portion of the resist based upon the resulting pattern; and performing a process to affect the upper surface of the wafer, a portion of the upper surface being affected being related to the resulting pattern.

13. The method of claim 12, wherein each segment is separated from a neighboring segment by a blocking region that extends from one of the substantially parallel edges to a neighboring one of the substantially parallel edges, wherein the blocking region comprises a region of the second tone value.

14. The method of claim 13, wherein the region of the first tone value is divided into three non-contiguous segments being divided by two blocking regions having different widths, the blocking regions comprising regions of the second tone value.

15. The method of claim 14, wherein the region of the first tone value is divided into four non-contiguous segments being divided by three blocking regions, each of the three blocking regions having a different width from the other two blocking regions, the blocking regions comprising regions of the second tone value.

16. The method of claim 12, wherein each region of the first tone value is separated from a neighboring segment by a block that is spaced between two neighboring ones of the substantially parallel edges, the block comprising a region of the second tone value.

17. The method of claim 12, wherein the region of the first tone value comprises a transmissive region and the regions of the second tone value comprises an opaque or semitransparent region.

18. The method of claim 12, wherein the region of the first tone value comprises an opaque or semitransparent region and the regions of the second tone value comprises a transmissive region.

19. The method of claim 12, wherein the resist comprises a positive resist.

20. The method of claim 12, wherein the resist comprises a negative resist.

21. The method of claim 12, wherein each segment is separated from a neighboring segment by at least one notch that extends from one of the substantially parallel edges toward a neighboring one of the substantially parallel edges, the notch comprising a region of the second tone value.

22. The method of claim 21, wherein each segment is separated from a neighboring segment by a first notch that extends from one of the substantially parallel edges toward a neighboring one of the substantially parallel edges and a second notch that extends from the neighboring one of the substantially parallel edges toward the one of the substantially parallel edges, the notch comprising a region of the second tone value.

23. A method of making a semiconductor device, the method comprising:

providing an alternating phase shift mask layout with a pattern formed thereon, the pattern including first, second and third pair of substantially parallel edges, the first pair being separated from the second pair by a first transmissive region that transmits light at a first phase and the second pair being separated from the third pair by a second transmissive region that transmits light at a second phase, both the first and second transmissive regions being divided into at least three non-contiguous segments, each segment is separated from a neighboring segment by a blocking region, the blocking region comprising an opaque or semitransparent feature, wherein the blocking region between the at least three non-contiguous segments is dimensioned to reduce a difference between a maximum width and a minimum width along a length of a resulting pattern;

providing a semiconductor wafer having a resist layer formed thereon;

irradiating the resist layer through the alternating phase shift mask to expose an upper surface of the wafer thereby forming the resulting pattern, the resulting pattern including the first, second and third substantially parallel pairs of edges; and performing a process to affect the upper surface of the wafer in a pattern based upon the resulting pattern.

24. The method of claim 23, wherein the first phase differs from the second phase by 180 degrees.

25. The method of claim 23, wherein each segment of the at least three non-contiguous segments has substantially a same size.

26. The method of claim 25, wherein the blocking regions are located in a predetermined pitch, the predetermined pitch being determined so as to reduce line-width waviness within the first, second and third pairs of substantially parallel edges.

27. A semiconductor mask for producing an image, the semiconductor mask comprising:

a transparent substrate; and a mask layer comprising adjacent mask region elements that transmit light disposed on the substrate, wherein each mask element is segmented into at least three non-contiguous segments, and each of the at least three non-contiguous segments is separated by a dimension selected to reduce a difference between a maximum width and a minimum width along a length of the image.

28. The semiconductor mask of claim 27, wherein the adjacent mask region elements comprise first mask region elements that transmit light with a first phase shift and a second mask region elements that transmit light with a second phase shift with respect to the first mask region elements, wherein the first mask region elements alternate with the second mask region elements, and wherein each mask region element is segmented into a plurality of segments, and where the mask region element is separated by a blocking region on the mask substrate, the blocking region comprising an opaque or semitransparent region.

29. The semiconductor mask of claim 27, wherein each mask element is segmented by a predetermined pitch, wherein there is a predetermined gap between segments and wherein the predetermined pitch and predetermined gap between segments are periodic.

30. The semiconductor mask of claim 29, wherein the segment pitch is adjusted near an end of a mask element.

31. The semiconductor mask of claim 29, wherein the segment pitch is adjusted near the middle of a mask element.

* * * * *